United States Patent
Pan et al.

(10) Patent No.: US 9,117,695 B1
(45) Date of Patent: Aug. 25, 2015

(54) METHOD FOR FABRICATING SEMICONDUCTOR DEVICE

(71) Applicant: UNITED MICROELECTRONICS CORP., Hsin-Chu (TW)

(72) Inventors: Ji Gang Pan, Beijing (CN); Han Chuan Fang, Singapore (SG); Boon-Tiong Neo, Singapore (SG)

(73) Assignee: UNITED MIRCOELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/328,697

(22) Filed: Jul. 10, 2014

(51) Int. Cl.
*H01L 21/8238* (2006.01)
*H01L 27/108* (2006.01)
*H01L 21/768* (2006.01)

(52) U.S. Cl.
CPC .... *H01L 27/10894* (2013.01); *H01L 21/76801* (2013.01)

(58) Field of Classification Search
CPC ............ H01L 27/10894; H01L 21/768; H01L 21/76801; H01L 21/76224; H01L 21/76229
USPC .................. 438/210, 238, 690, 691, 692, 693
See application file for complete search history.

(56) References Cited

U.S. PATENT DOCUMENTS

| | | | |
|---|---|---|---|
| 7,214,579 B2 | 5/2007 | Widdershoven et al. | |
| 8,017,467 B2 * | 9/2011 | Yaegashi | 438/201 |
| 8,133,777 B1 * | 3/2012 | Chiang et al. | 438/199 |
| 2006/0270181 A1 * | 11/2006 | Sandhu et al. | 438/424 |
| 2011/0084325 A1 * | 4/2011 | Wang et al. | 257/296 |
| 2012/0309155 A1 * | 12/2012 | Wang et al. | 438/294 |

OTHER PUBLICATIONS

Cheng, Title of Invention: Method of Fabricating Semiconductor Device, U.S. Appl. No. 14/082,200, filed Nov. 18, 2013.
Kyung-Woong Park et al., "Effects of the Size and the Concentration of the Abrasive in a Colloidal Silica (SiO2) Slurry with Added TMAH on Removal Selectivity of Polysilicon and Oxide Films in Polysilicon Chemical Mechanical Polishing", Journal of the Korean Physical Society, vol. 51, No. 1, Jul. 2007, pp. 214-223, Mar. 29, 2007.

* cited by examiner

*Primary Examiner* — Kevin M Picardat
(74) *Attorney, Agent, or Firm* — Winston Hsu; Scott Margo

(57) ABSTRACT

A method for fabricating semiconductor device is disclosed. The method includes the steps of: providing a substrate having a memory region and a periphery region; forming a memory cell on the memory region; forming a first polysilicon layer on the periphery region and the memory cell; forming a patterned cap layer on the periphery region; forming a second polysilicon layer on the first polysilicon layer and the patterned cap layer; and performing a chemical mechanical polishing (CMP) process to remove the second polysilicon layer, wherein the chemical mechanical polishing process comprises an abrasive of greater than 13% and a remove rate of less than 30 Angstroms/second.

8 Claims, 7 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly to a method of fabricating flash memory.

2. Description of the Prior Art

A flash memory is a non-volatile memory, which can preserve data within the memory even when an external power supply is off. Recently, because flash memories are electrically re-writable and electrically re-erasable, they have been widely applied in the fabrication of electrical products, such as mobile phones, digital cameras, video players, personal digital assistants (PDA) or systems on a chip (SOC).

To meet the requirements of low power consumption, fast response, low cost and high integration rate of electronic products, integrating processes of different semiconductor devices having various electrical performances and functions is the trend of current semiconductor processes. For example, flash memory cells in the flash memory array area and metal-oxide-semiconductor transistors (MOS) in the logic circuit area may be fabricated in the same chip.

Nevertheless, current approach for integrating flash memory cells and MOS transistors typically encounter serious issues when an oxide cap layer is sandwiched between two polysilicon layers before the polysilicon layers are patterned into word line and gate patterns for the MOS transistors. For instance, the presence of the oxide cap layer often induces defects between control gates of the flash memory cell and lowers the uniformity of the device within wafer. Hence, how to improve the current process flow for integrating flash memory cells and MOS transistors for providing a device with improved performance has become an important task in this field.

SUMMARY OF THE INVENTION

According to a preferred embodiment of the present invention, a method for fabricating semiconductor device is disclosed. The method includes the steps of: providing a substrate having a memory region and a periphery region; forming a memory cell on the memory region; forming a first polysilicon layer on the periphery region and the memory cell; forming a patterned cap layer on the periphery region; forming a second polysilicon layer on the first polysilicon layer and the patterned cap layer; and performing a chemical mechanical polishing (CMP) process to remove the second polysilicon layer, wherein the chemical mechanical polishing process comprises an abrasive of greater than 13% and a remove rate of less than 30 Angstroms/second.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
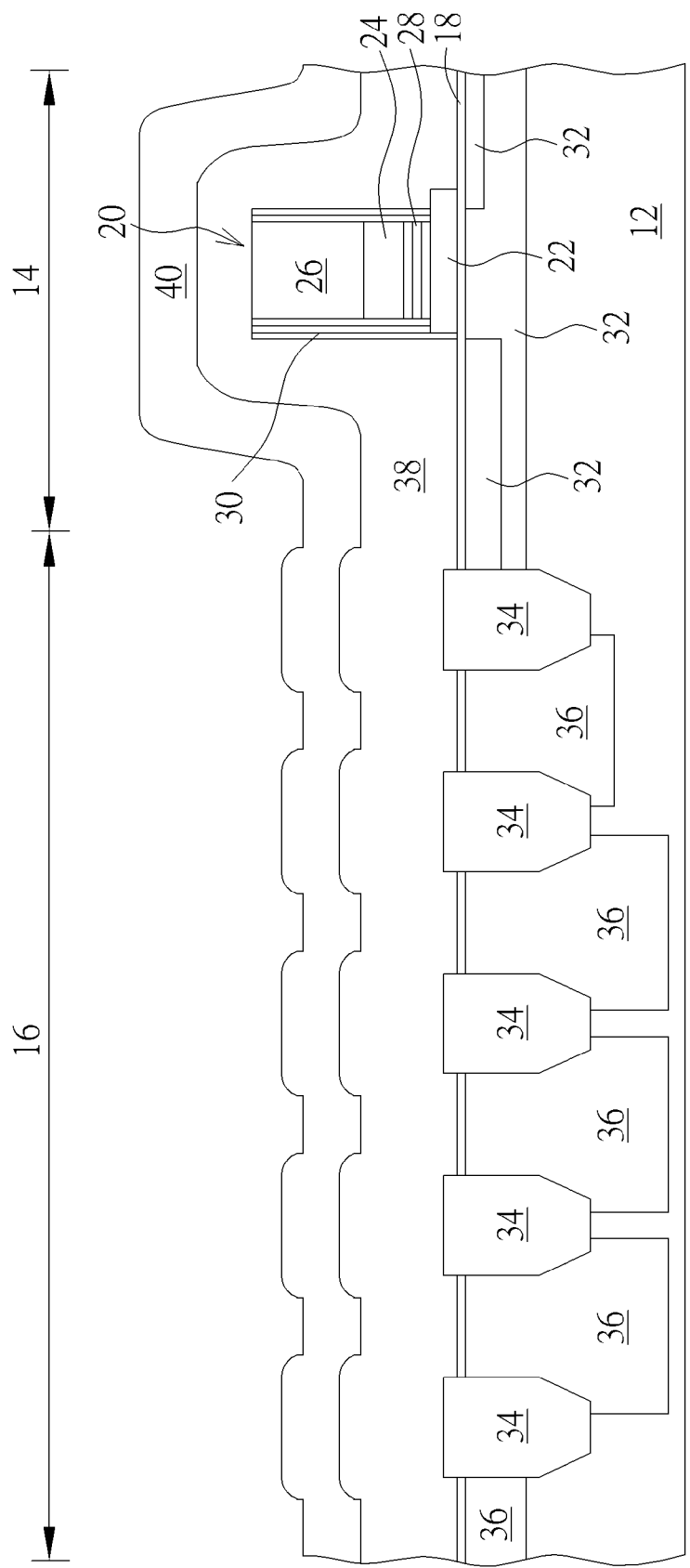
FIGS. 1-7 illustrate a method for fabricating semiconductor device according to a preferred embodiment of the present invention.

Referring to FIGS. 1-7, FIGS. 1-7 illustrate a method for fabricating semiconductor device according to a preferred embodiment of the present invention. As shown in FIG. 1, a substrate 12 is provided, in which the substrate 12 includes a memory region 14 and a periphery region 16 defined thereon. The substrate 12 could be composed of silicon, AsGa, silicon on insulator (SOI) layer, epitaxial layer, SiGe layer or other semiconductor materials, and a gate oxide layer 18 is formed on both memory region 14 and periphery region 16 of the substrate 12.

A memory cell 20 is formed on the memory region 14, in which the memory cell 20 preferably includes a protruding floating gate 22 on the substrate 12, a control gate 24 on the floating gate 22, a hard mask 26 on the control gate 24, and an oxide-nitride-oxide (ONO) stacked layer 28 serving as an inter-gate dielectric layer between the floating gate 22 and the control gate 24. A spacer 30 may also be formed on the sidewall of the memory cell 20, in which the spacer 30 could be a single layered structure or a composite layered structure selected from materials consisting of silicon oxide and silicon nitride. The hard mask 26 is composed of silicon nitride, but not limited thereto. A plurality of implanted regions 32 could also be formed in the substrate 12 adjacent to two sides of the floating gate 22 as well as directly under the memory cell 20 depending on the demand of the product.

Preferably, a plurality of shallow trench isolations (STIs) 34 and implanted regions 36 are formed in the periphery region. In this embodiment, the implanted regions includes p-well and n-well for fabricating MOS transistors and high-voltage p-well and high-voltage n-well for fabricating high-voltage MOS transistors. However, it should be noted that the quantity and layout of the STIs 34 and implanted regions 36 are not limited to the ones disclosed in the figure. Instead, any implanted regions with corresponding STIs could be formed in the substrate 12 of the periphery region 16 according to the design of the product, which is also within the scope of the present invention.

Next, a first polysilicon layer 38 is deposited on the periphery region 16 and the memory region 14, in which the first polysilicon layer 38 preferably covers all of the STIs 34 and implanted regions 36 in the periphery region 16 and the memory cell 20 in the memory region 14. Preferably, the first polysilicon layer 38 is utilized for forming word lines in the memory region 14 and gate patterns in the periphery region 16 in the later process. The first polysilicon layer 38 could be doped or undoped, and the thickness of the first polysilicon layer 38 is between 900 Angstroms to 1100 Angstroms, and more preferably at 1000 Angstroms.

A cap layer 40 is then formed on the first polysilicon layer 38, in which the cap layer 40 is preferably composed of silicon dioxide. The thickness of the cap layer is between 1700 Angstroms to 1900 Angstroms, and more preferably at 1800 Angstroms.

Figure 2:
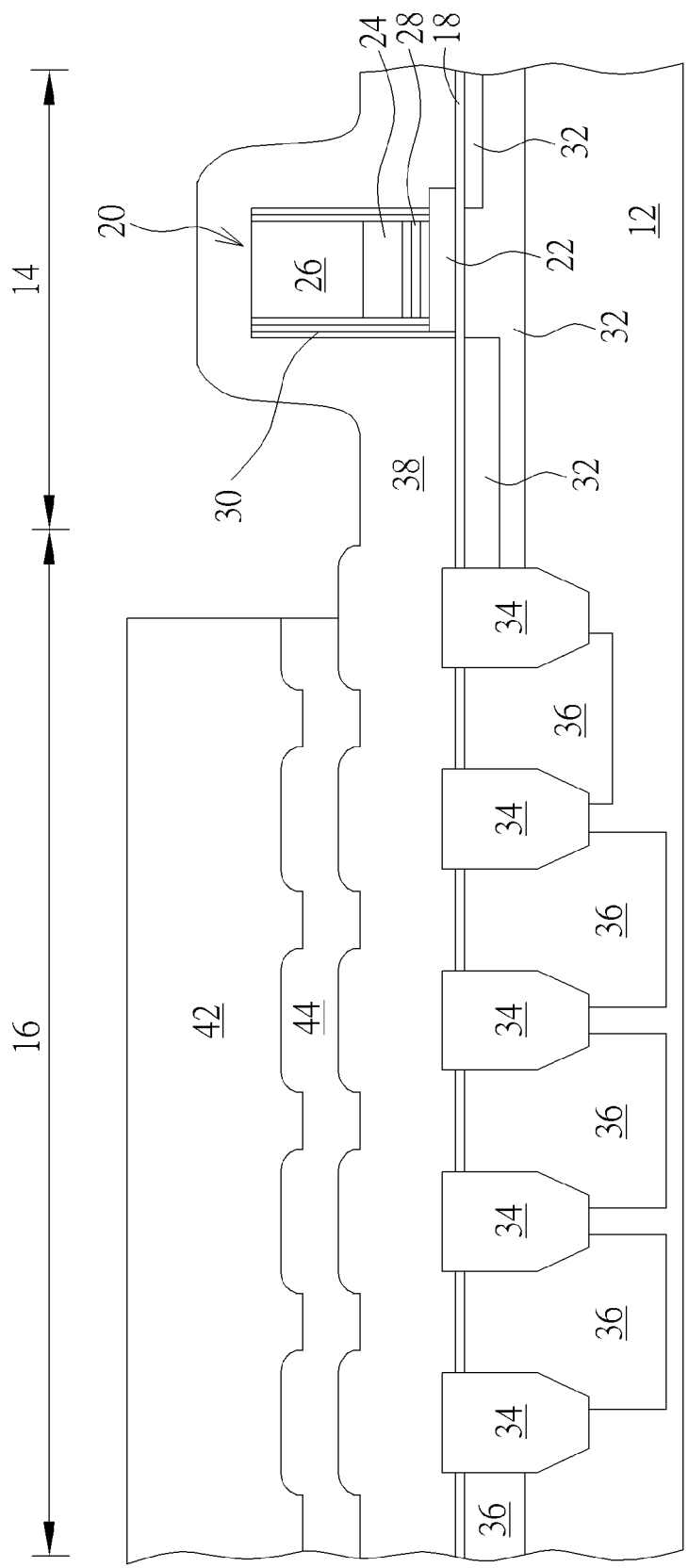

Next, as shown in FIG. 2, a photo-etching process is conducted by first forming a patterned resist 42 on the cap layer 40, and then performing a dry etching process by using the patterned resist 42 as mask to remove part of the cap layer 40 not covered by the patterned resist 42. This forms a patterned cap layer 44 on the first polysilicon layer 38 of the periphery region 16.

Figure 3:
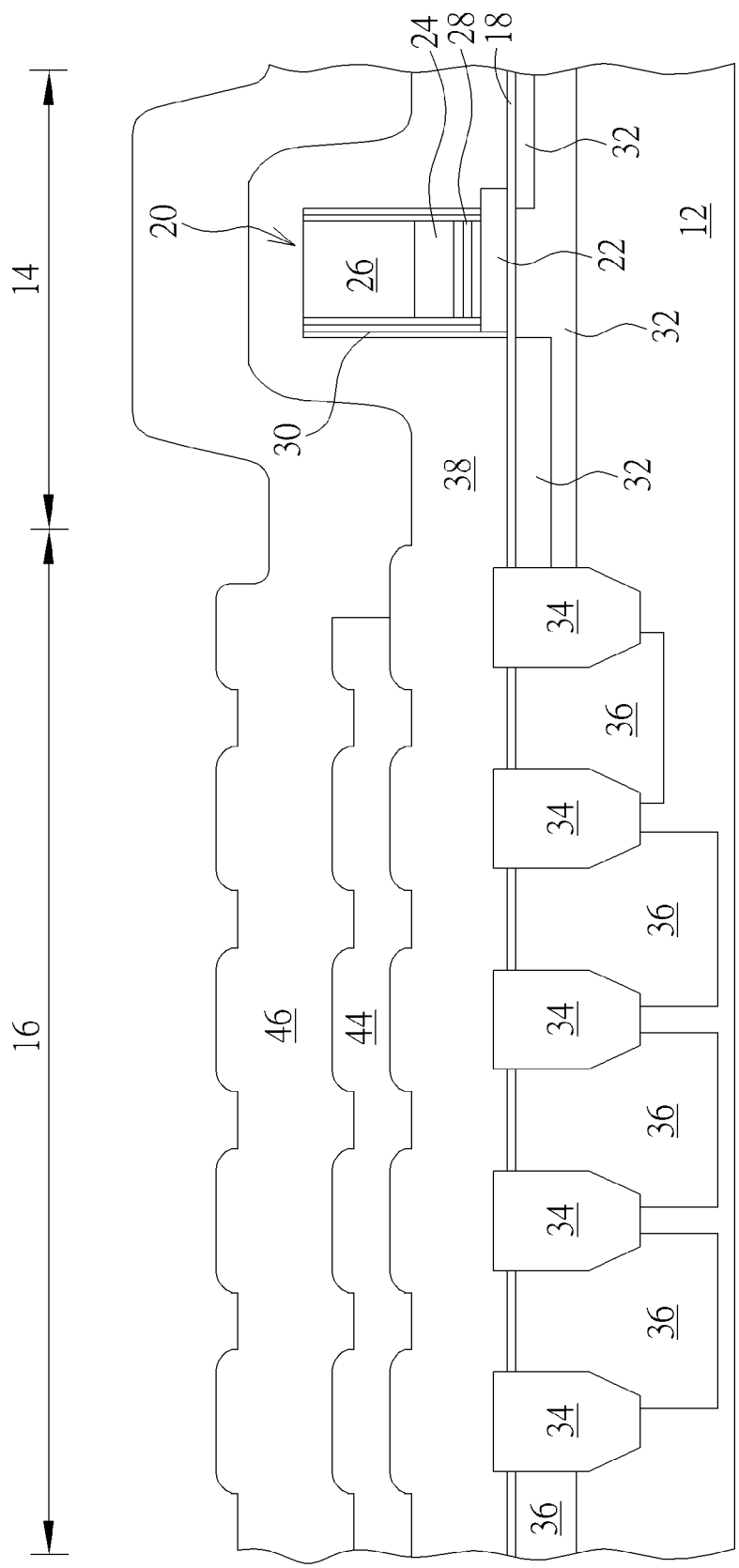

Next, after stripping the patterned resist 42, as shown in FIG. 3, a second polysilicon layer 46 is formed on the first polysilicon layer 38 and the patterned cap layer 44. The formation of the second polysilicon layer 46 may be accomplished by methods such as low pressure chemical vapor deposition (LPCVD) or plasma-enhanced chemical vapor deposition (PECVD) processes, and the deposition temperature for forming the second polysilicon layer 46 is preferably controlled below 620° C. According to a preferred embodiment of the present invention, the thickness of the second polysilicon layer 46 is between 2000 Angstroms to 4000 Angstroms, and preferably at 3000 Angstroms, and despite the second polysilicon layer 46 could be composed of doped polysilicon or undoped doped polysilicon, it is more preferably that the second polysilicon layer 46 be composed of undoped polysilicon.

Figure 4:
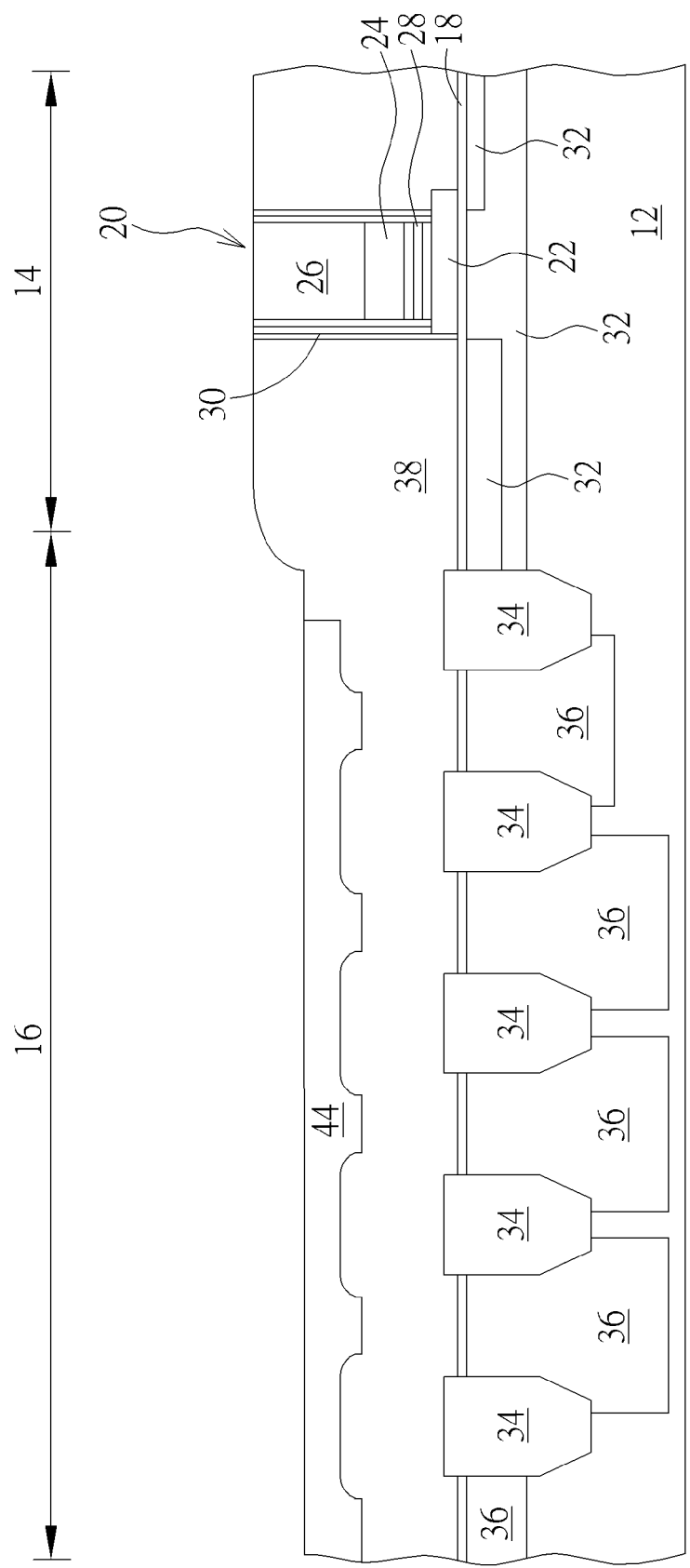

Next, as shown in FIG. 4, a chemical mechanical polishing (CMP) process is conducted by using the hard mask 26 as a stop layer to partially remove the second polysilicon layer 46 and the first polysilicon layer 38 for exposing the hard mask 26 of the memory cell 20 while the second polysilicon layer 46 on the patterned cap layer 44 is also removed simultaneously to expose the patterned cap layer 44 underneath.

It should be noted that the slurry used in the CMP process includes chemical agents and abrasives, in which the chemical agents may be PH buffers, oxidants, surfactants or the like, and the abrasives may be silica, alumina, zirconium oxide, or the like. According to a preferred embodiment of the present invention, the abrasive used during the CMP process is greater than 13% and the remove rate of the CMP process is less than 30 Angstroms/second.

In this embodiment, the remaining thickness of the patterned cap layer 44 is approximately 1300 Angstroms while the height of the remaining first polysilicon layer 38 and second polysilicon layer 46 adjacent to the memory cell 20 is approximately 2450 Angstroms.

Figure 5:
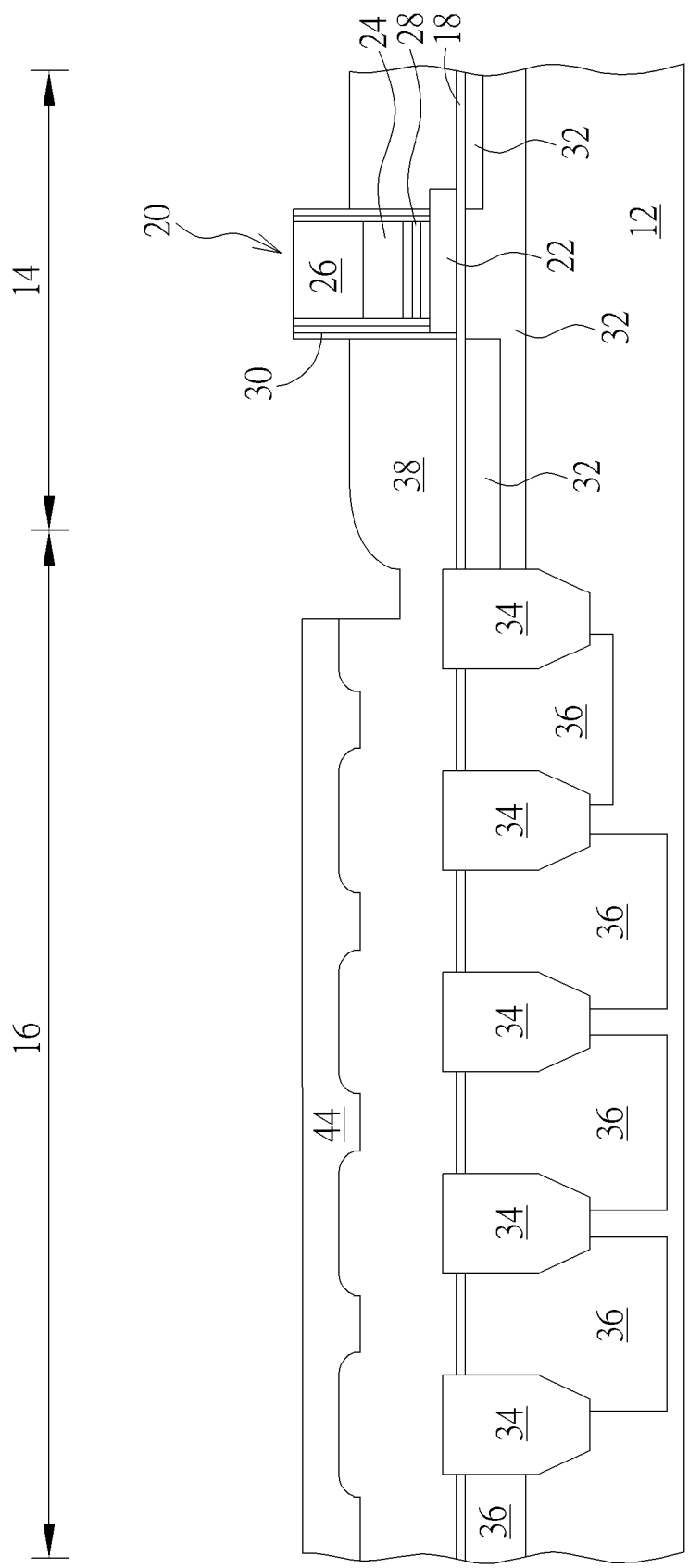

Next, as shown in FIG. 5, an etching back process is conducted by using the remaining patterned cap layer 44 as mask to remove part of the first polysilicon layer 38 and second polysilicon layer 46 in the memory region 14. The etching back preferably removes part of the first polysilicon layer 38 and all of the second polysilicon layer 46 adjacent to the memory cell 20 while a small part of the patterned cap layer 44 may also be lost at the same time. The height of the remaining patterned cap layer 44 is approximately 850 Angstroms and the height of the remaining first polysilicon layer 38 defines the heights of a word line and erase gate that will be formed afterwards.

Figure 6:
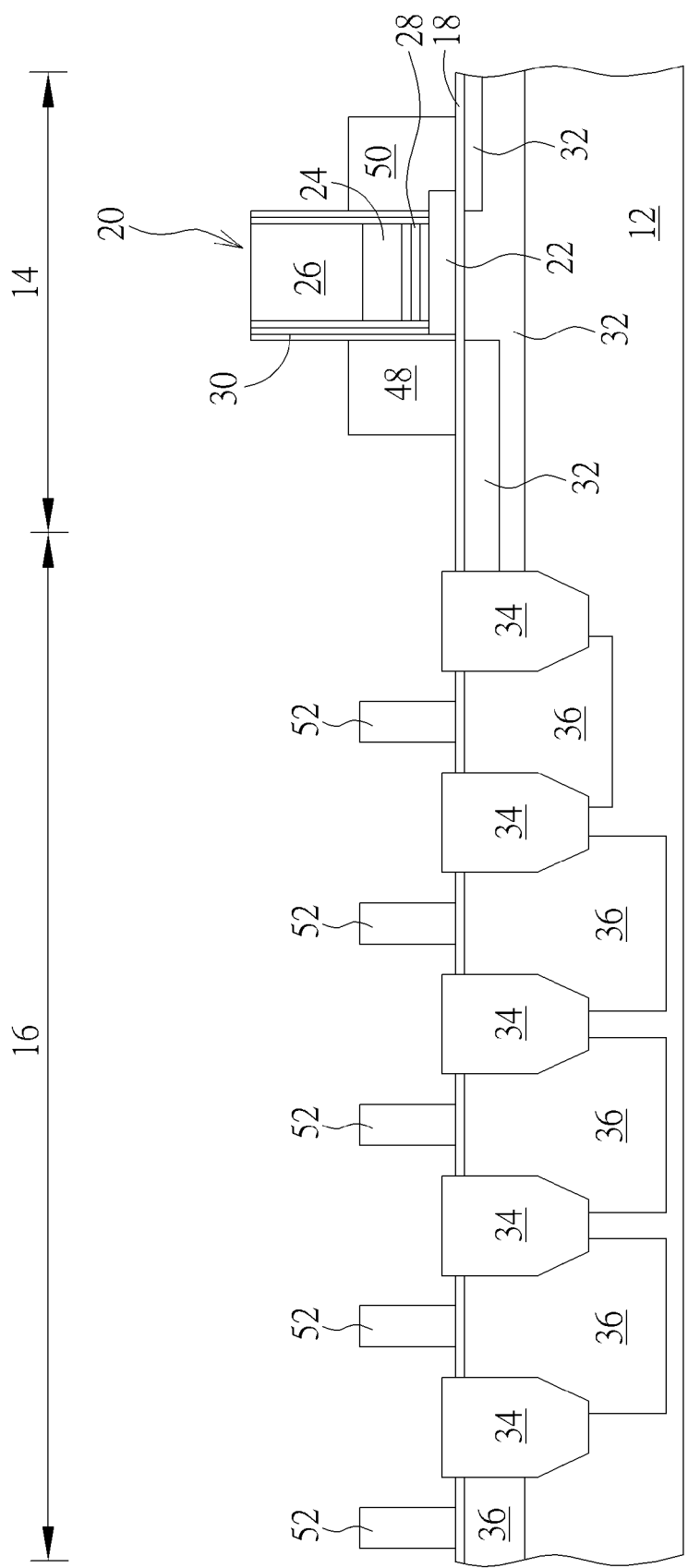

Next, as shown in FIG. 6, an etching process is first conducted to remove the patterned cap layer 44 in the periphery region 16 and another photo-etching process is conducted to pattern the first polysilicon layer 38 into a word line 48 and an erase gate 50 adjacent to the memory cell 20 and a plurality of gate patterns 52 in the periphery region 16.

Figure 7:
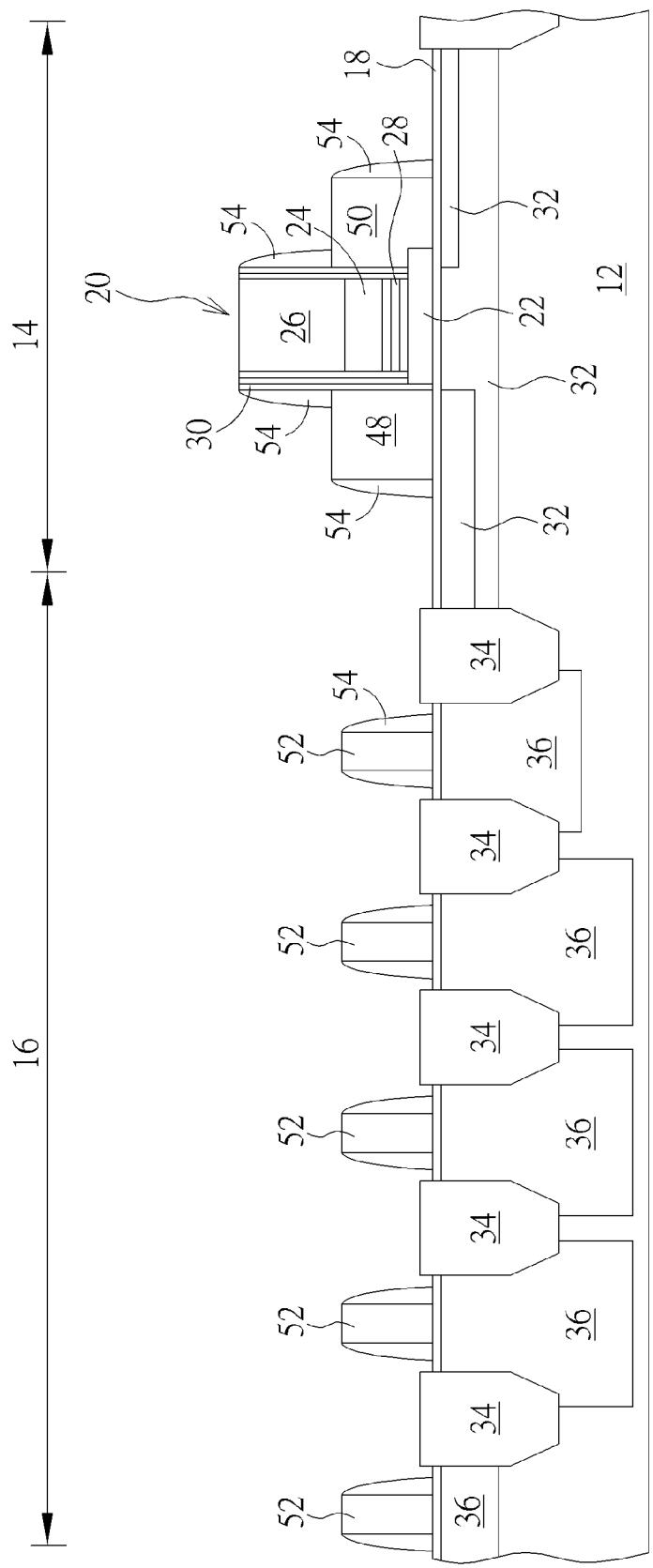

As shown in FIG. 7, a spacer formation could be conducted thereafter to form a plurality of spacers 54 adjacent to each of the gate patterns 52 in the periphery region 16 and the word line 48, the hard mask 26, and erase gate 50 in the memory region 14. This completes the fabrication of a semiconductor device.

Overall, the present invention first forms a memory cell having pre-formed floating gate and control gate on a substrate, sequentially forms a first polysilicon layer, an oxide patterned cap layer, and a second silicon layer on top of the memory cell, and then conducts a CMP process with distinct recipe involving an abrasive of greater than 13% and a remove rate of less than 30 Angstroms/second to remove the second polysilicon layer. By eliminating the need of forming an extra oxide layer atop the second polysilicon layer as in the conventional art and adjusting the abrasive percentage and remove rate as disclosed, the present invention is able to improve drawbacks such as cap oxide defect while improving the uniformity of the device within wafer substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a memory region and a periphery region;
   forming a memory cell on the memory region;
   forming a first polysilicon layer on the periphery region and the memory cell;
   forming a patterned cap layer on the periphery region;
   forming a second polysilicon layer on the first polysilicon layer and the patterned cap layer; and
   performing a chemical mechanical polishing (CMP) process to remove the second polysilicon layer, wherein the chemical mechanical polishing process comprises an abrasive of greater than 13% and a remove rate of less than 30 Angstroms/second.

2. The method of claim 1, wherein the memory cell comprises:
   a floating gate on the substrate;
   a control gate on the floating gate; and
   a hard mask on the control gate.

3. The method of claim 2, wherein the hard mask comprises silicon nitride.

4. The method of claim 1, wherein the patterned cap layer comprises silicon dioxide.

5. The method of claim 1, wherein the second polysilicon layer comprises undoped polysilicon.

6. The method of claim 1, wherein the thickness of the second polysilicon layer is between 2000 Angstroms to 4000 Angstroms.

7. The method of claim 1, further comprising forming the second polysilicon layer at under 620° C.

8. The method of claim 1, further comprising:
   performing the CMP process to partially remove the second polysilicon layer and the first polysilicon layer to expose the memory cell;
   etching back part of the first polysilicon layer in the memory region;
   removing the patterned cap layer from the periphery region; and
   patterning the first polysilicon layer to form a word line and an erase gate adjacent to the memory cell and a plurality of gate patterns in the periphery region.

* * * * *